(12) United States Patent
Phillips et al.

(10) Patent No.: US 7,160,132 B2
(45) Date of Patent: Jan. 9, 2007

(54) BATTERY PACK—CORDLESS POWER DEVICE INTERFACE SYSTEM

(75) Inventors: Steven J. Phillips, Ellicott City, MD (US); Daniele C. Brotto, Baltimore, MD (US); David A. Carrier, Aberdeen, MD (US); Jeffrey J. Francis, Nottingham, MD (US); Andrew E. Seman, Jr., White Marsh, MD (US); Danh Thanh Trinh, Towson, MD (US); Christopher R. Yahnker, Raleigh, MD (US); James B. Watson, Fallston, MD (US); Daniel J. White, Baltimore, MD (US)

(73) Assignee: Black & Decker Inc., Newark, DE (US)

( * ) Notice: Subject to any disclaimer, the term of this patent is extended or adjusted under 35 U.S.C. 154(b) by 16 days.

(21) Appl. No.: 11/093,812

(22) Filed: Mar. 30, 2005

(65) Prior Publication Data
US 2005/0221654 A1 Oct. 6, 2005

Related U.S. Application Data

(60) Provisional application No. 60/558,176, filed on Mar. 31, 2004.

(51) Int. Cl.
*H01R 4/50* (2006.01)

(52) U.S. Cl. .................................. 439/341; 439/953
(58) Field of Classification Search ................ 439/341, 439/500, 953; 310/50; 320/112–114
See application file for complete search history.

(56) References Cited

U.S. PATENT DOCUMENTS

| | | | | |
|---|---|---|---|---|
| 3,602,586 A | * | 8/1971 | Bartl et al. | 352/243 |
| 3,728,664 A | * | 4/1973 | Hurst | 439/341 |
| 3,969,796 A | * | 7/1976 | Hodsdon et al. | 24/270 |
| 4,084,123 A | * | 4/1978 | Lineback et al. | 320/111 |
| 5,148,353 A | * | 9/1992 | Morgan et al. | 361/726 |
| 5,208,525 A | * | 5/1993 | Lopic et al. | 320/112 |
| 6,038,892 A | * | 3/2000 | Schmitt | 70/78 |
| 6,057,608 A | | 5/2000 | Bailey, Jr. et al. | |

\* cited by examiner

*Primary Examiner*—Neil Abrams
(74) *Attorney, Agent, or Firm*—Harness, Dickey & Pierce P.L.C.

(57) ABSTRACT

A battery pack for a cordless power tool and a cordless power tool and battery pack combination includes the battery pack having a retention member that pivotally engages a retention member of the power tool and a latch system in which one of the battery pack and power tool has a ball and the other of the power tool and battery pack has a latch that engages the ball. Spring biased actuators may be used to open the latch to enable insertion or release of the ball from the latch.

15 Claims, 14 Drawing Sheets

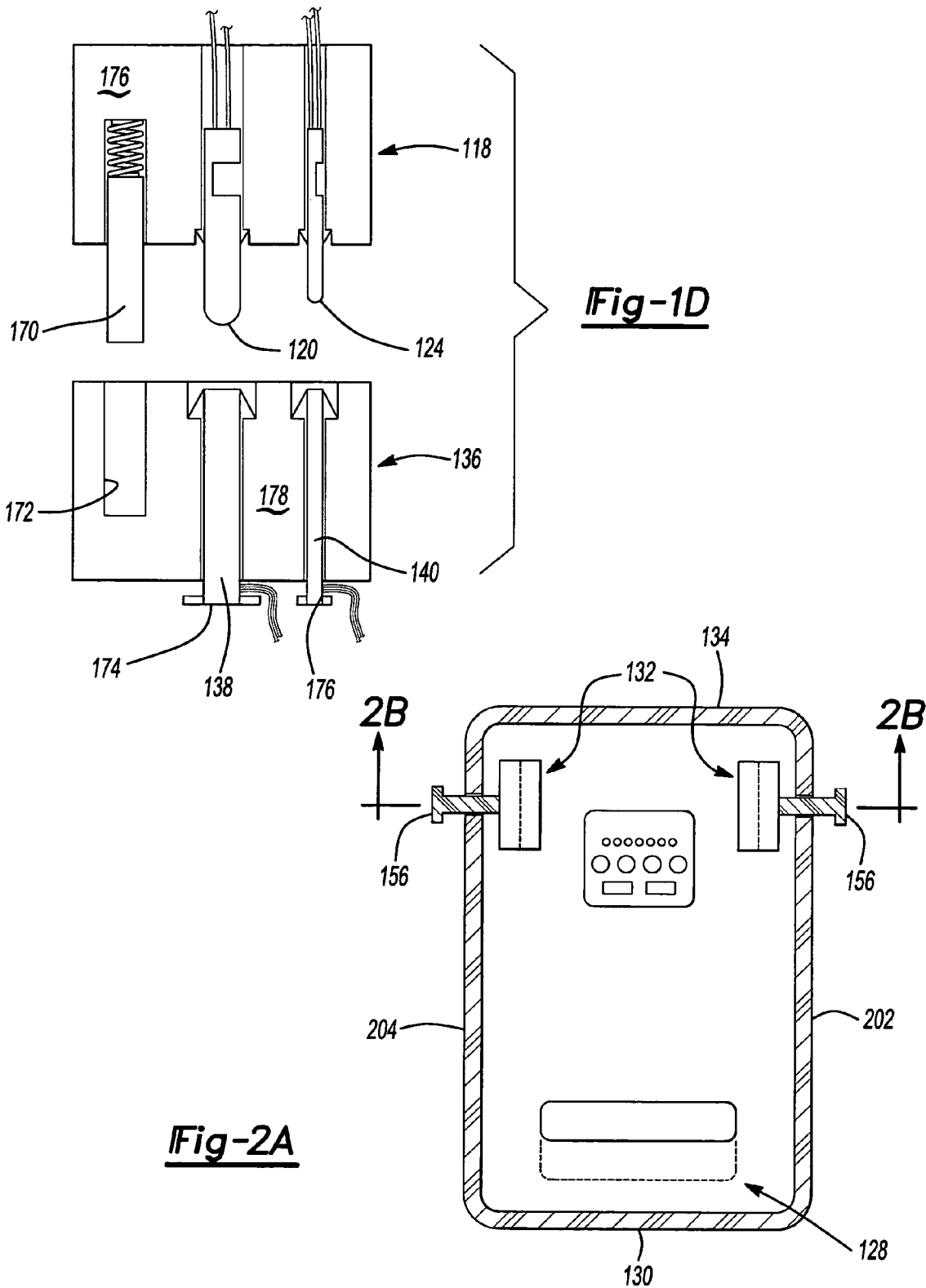

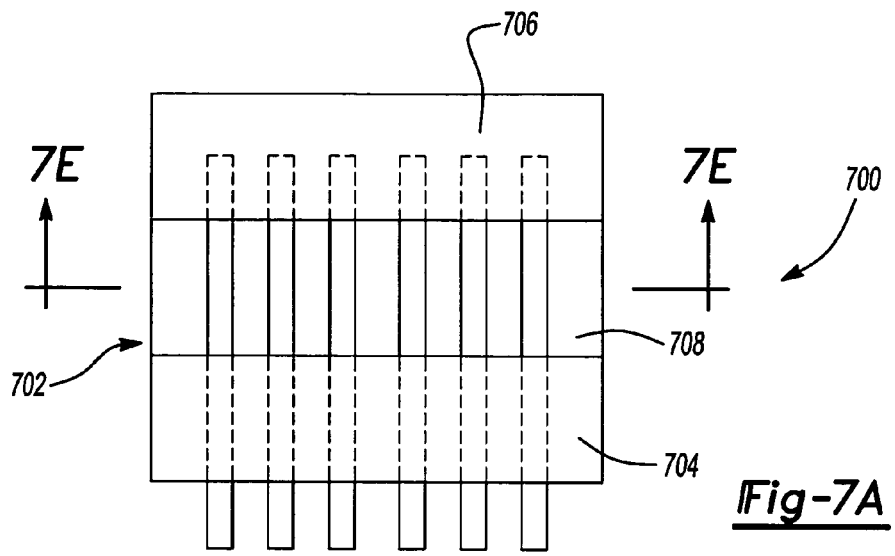
*Fig-7A*
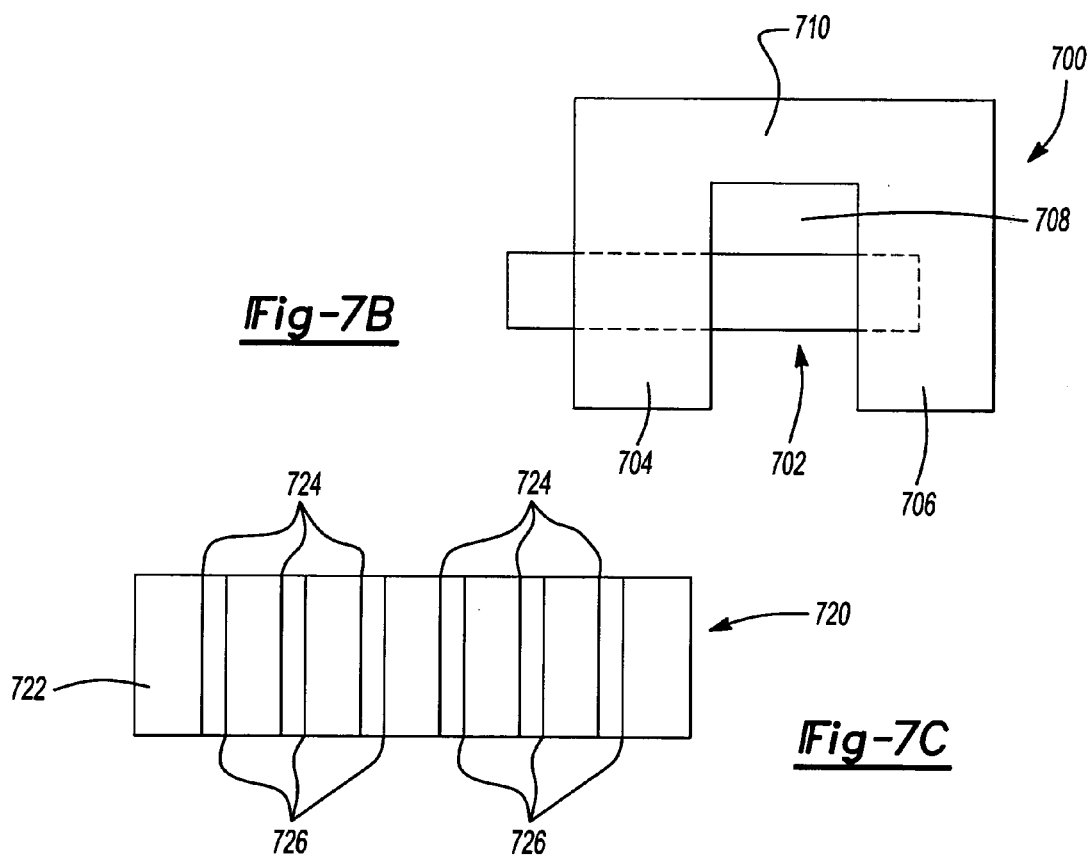
*Fig-7B*
*Fig-7C*

BATTERY PACK—CORDLESS POWER DEVICE INTERFACE SYSTEM

CROSS-REFERENCE TO RELATED APPLICATIONS

This application claims the benefit of U.S. Provisional Application No. 60/558,176 filed Mar. 31, 2004. The disclosure of the above application is incorporated herein by reference.

FIELD OF THE INVENTION

The present invention relates to cordless power devices that use battery packs, and more particularly, an interface system in a cordless power device and battery pack that interfaces the two together.

BACKGROUND OF THE INVENTION

Some cordless power devices have an integrated battery pack that rarely needs to be removed by the user. The battery pack remains in the device for both charge and discharge cycles. Cell phones are a typical example and have battery packs that are charged while installed in the phones. This is possible for two main reasons: the battery can usually provide sufficient power for the cell phone for a relatively long period of time such as one to two days, and the user is not severely inconvenienced by charging the battery while it is still in the phone. Cell phones when on are typically in the stand-by mode waiting for the user to engage in a call and are typically used in the call mode where the user is engaged in a phone call for only short periods of time. Since cell phones draw relatively little power when in the stand-by mode, the battery can typically provide sufficient power to power the cell phone for the one to two day period.

These reasons do not apply to other types of cordless power devices, such as power tools. These other types of cordless power devices are often used continuously or frequently for relatively long period of times, such as during a work shift, and may use more than one battery pack during that period. For example, a cordless saw or drill used on a construction site may be used throughout the work shift and may use multiple battery packs during the shift. Plugging such a cordless power tool into a charger during use would be inconvenient, obviating the advantages provided by a cordless power tool, and in some cases isn't possible due to the lack of AC mains power where the cordless power tool is being used. For these reasons, cordless power devices such as cordless power tools are not well suited for using integral batteries. These cordless power devices, particularly cordless power tools for professional use, therefore have removable battery packs so that used battery packs can be swapped with fresh battery packs during the work shift and the used battery packs placed in a charger for recharging.

The design of the interface system between the battery pack and the cordless power device is important. "Interface system" as used herein means the elements of the cordless power device and battery pack that cooperate when the battery is inserted and removed in the cordless power device, including the elements that releasably secure the battery pack in the cordless power tool and those that provide the electrical connection(s) between the battery pack, the cordless power device, and the charger.

The designs of interface systems presently used for cordless power devices that use battery packs, particularly cordless power tools, leave something to be desired with regard to ease of use, latching, and/or electrical connections. The two most common types of interface systems used in cordless power tools having battery packs are the "tower cell" design, which is used in the DEWALT® 7.2V–18V systems, and the "rail-style" design, which is used in the DEWALT® 24V system.

U.S. Pat. No. 4,871,629 issued Oct. 3, 1989 for "Latching Arrangement for Battery Packs" shows an example of a cordless power tool in which the "tower-cell" design interface system is used. A distinguishing characteristic of the "tower-cell" interface system is that the removable battery pack includes a tower extending from a main body or base in which at least one battery cell is typically disposed, with the remaining battery cells disposed in the main body. The "tower-cell" interface system has a number of advantages. They include ease of insertion and removal. The tower aligns the battery terminals to the tool to facilitate insertion. One handed insertion is both possible and convenient. The latch buttons are placed in a natural grip position, making them easy to actuate with one hand, and gravity aids in the removal of the battery pack. The advantages of the "tower-cell" interface system also include utilization of the dead space in the tool handle in that the "tower-cell" fills up space in the foot of the tool, making the overall battery pack size when it is inserted in the tool seem smaller and user familiarity in that the "tower-cell" interface system is a commonly used interface system in today's cordless power tools.

The "tower-cell" design interface system can have certain disadvantages. They include the possibility of thermal imbalance due to the "tower-cell" being separated from the larger cluster of cells in the main body of the battery pack and thus tends to be at a different temperature during operation of the tool. The "tower-cell" design also typically introduces extra manufacturing processes and components, thus increasing manufacturing complexity. In a number of products utilizing the "tower-cell" interface system the "tower-cell" connections in the battery pack have presented reliability concerns. The relatively small terminal block area of the "tower-cell" design tends to preclude adding additional terminals to the terminal block. Also, the entire weight of the battery pack is supported by the latches which secure the battery pack to the tool and the contact area of the latches to the tool tends to be small, placing a relatively high amount of stress on the latches.

U.S. Pat. No. 6,057,608 issued May 2, 2000 for a "Cordless Power Tool System" shows an example of a cordless power tool in which the "rail-style" design interface system is used. A distinguishing characteristic of the "rail-style" design is that the battery pack housing has rails that ride on rails or rail sections of the tool housing. The "rail-style" design interface system has a number of advantages. They include battery pack retention in that there are separate mechanisms for supporting the weight of the battery pack (e.g., rails) and securing the battery pack to the tool (e.g., latch). The relatively large terminal block area of the battery pack facilitates system expansion in that there is space to add additional terminals. The cells are all contained in the body of the battery pack and no one cell is located remote from the other cells so that there is better thermal balance among the respective cells. The "rail-style" design interface system has better manufacturing consistency than the "tower-cell" design interface system in that there is no need to deal with the additional manufacturing complexity added by needing to deal with the "tower-cell." Since all the cells are connected in the same way, the "rail-style" design interface system does not have the reliability concerns due to the "tower-cell" connections that some products using the "tower-cell" design interface system have experienced.

The "rail-style" design interface system can have certain disadvantages. They include rail contamination which makes insertion and removal of the battery pack more difficult. Insertion and removal of the battery pack is awkward compared to the "tower-cell" design interface system in that two hands are typically required to insert or remove the battery pack. Also, pushing or pulling on the battery pack during insertion and removal creates a moment about the tool making it more difficult to hold the tool in place. The battery pack housing has a "clamshell" construction and the tolerances of the rail dimensions are difficult to hold in the assembly of the clamshell, making rail travel "sticky." The foot of the tool has dead space in that there is no "tower-cell" that fills the space in the foot of the tool.

SUMMARY OF THE INVENTION

A battery pack for a cordless power tool and a battery pack and cordless power tool combination. Each of the power tool and battery pack has at least one retention member that pivotally engages the retention member of the other of the power tool and battery pack. It also includes a latch system where one of the power tool and the battery pack has a ball and the other of the power tool and battery pack has a latch that engages the ball. In an aspect of the invention, the power tool has the ball and the battery pack has the latch.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 1D is a cross-sectional view of the terminal blocks of the interface system of FIGS. 1A and 1B having a spring-loaded ejector pin;

FIG. 2A is a top view of the battery pack of FIGS. 1A and 1B with a variation of the latch;

FIG. 7A is a bottom view of an alternative terminal block in accordance with an aspect of the invention;

FIG. 7B is a front view of the terminal block of FIG. 7A;

FIG. 7C is a top view of a terminal block that mates with the terminal block of FIG. 7A;

DETAILED DESCRIPTION OF THE PREFERRED EMBODIMENTS

The following description of the preferred embodiment(s) is merely exemplary in nature and is in no way intended to limit the invention, its application, or uses. For convenience, the invention will be discussed in the context of cordless power tools but it should be understood that it can be used in any cordless power device where battery packs are used.

Figure 1A:
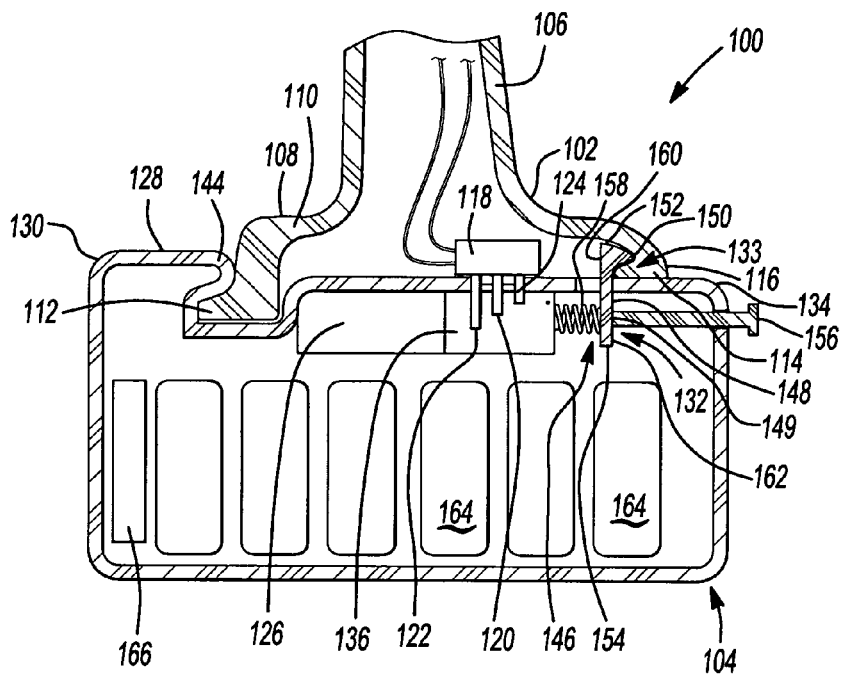
FIG. 1A is a side cross-sectional view of a cordless power tool and battery pack interface system in accordance with an embodiment of the invention.
Figure 1B:
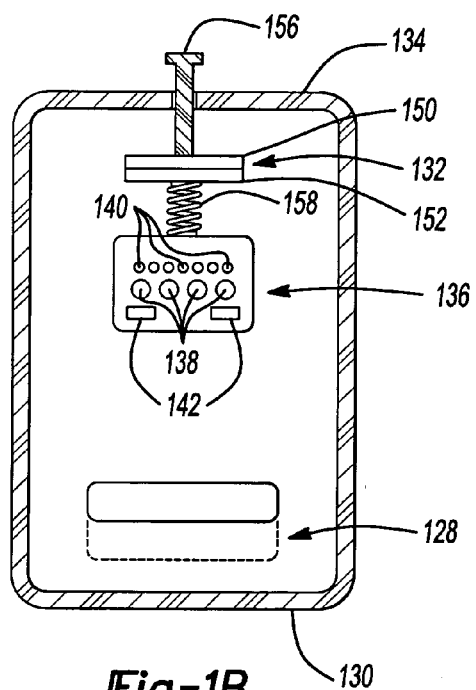
FIG. 1B is a top view of the battery pack of FIG. 1A.

FIGS. 1A and 1B show an interface system 100 in accordance with an embodiment of the invention in a cordless power tool 102 and a removable battery pack 104. As used herein, "interface system" means the elements of the cordless power tool and the battery pack that are used in mating the cordless power tool and battery pack and securing the battery pack in the cordless power tool.

Interface system 100 includes a rear retention member 112 (illustratively an outwardly extending lip or flange) at a rear end 110 of a foot 108 of a housing 106 of cordless power tool 102. Interface system 100 also includes a front retention member 114 (illustratively an inwardly extending lip or flange) at a front 116 of foot 108 of tool housing 106. Interface system 100 also includes terminal block 118 mounted within foot 108 of tool housing. Terminal block 118 includes power terminals 120 and may also include one or more keys 122. It may also include one or more data terminals 124. Power terminals 120 are illustratively heavier duty terminals compared with data terminals 124 and are used to carry power between battery pack 104 and cordless power tool 102. In the embodiment shown in FIGS. 1A and 1B, there are illustratively two power terminals 120 for the positive side and two power terminals 120 for the negative or common side. Power terminals 120 are coupled to a motor (not shown) of cordless power tool 102. The positive and negative power terminals 120 may be coupled directly to the motor, such as would be the case when a controller 126 of battery pack 104 provides power control for cordless power tool 102, or one or both of positive and negative power terminals 120 may be coupled through a controller and/or a switch (not shown) of cordless power tool 102 in conventional fashion. In an embodiment, one or both of positive and negative power terminals 120 may be coupled to the motor through a switch of cordless power tool 102 even with controller 126 providing power control for cordless power tool 102. In this embodiment, the switch of cordless power tool 102 may for example switch cordless power tool 102 on and off and provide a signal to controller 126 of battery pack 104 that controller 126 uses in, for example, providing variable speed control of cordless power tool 102.

While the use of one or more keys 122 is preferred for the reasons discussed below, it should be understood that key(s) 122 could be dispensed with. Similarly, data terminals 124 may be dispensed with if there is no data communication between battery pack 104 and cordless power tool 102. Similarly power connections could be accomplished using one positive and one negative power terminal 120.

Interface system 100 includes battery pack 104 having a rear retention member 128 illustratively located at an upper rear 130 of battery pack 104, at least one latch 132 illustratively located at a front 134 of battery pack 104, and a terminal block 136. Terminal block 136 includes power terminals 138 and may also include data terminals 140 and keyway(s) 142. When battery pack 104 is attached to cordless power tool 102, power terminals 138 of terminal block 136 of battery pack 104 mate with power terminals 120 of terminal block 118 of cordless power tool 102, data terminals 140 of terminal block 136 mate with data terminals 124 of terminal block 118 and key(s) 122 of terminal block 118 mate with keyway(s) 142 of terminal block 136. Power terminals 120 and data terminals 124 of terminal block 118 are illustratively male terminals with power terminals 138 and data terminals 140 of terminal block 136 illustratively being female terminals. Using female terminals in terminal block 136 of battery pack 104 provides better isolation of the terminals from possible contact with conductive surfaces when the battery pack is not received in cordless power tool 102, or in a charger. It should be understood, however, that power terminals 120 could be female terminals with power terminals 138 then being male terminals and that data terminals 124 could be female terminals with data terminals 140 being male terminals. In this regard, some of power terminals 120 could be male and the remainder of power terminals 120 be female, with power terminals 138 then being the opposite. The same could be the case with data terminals 124 and 140, some could be male with the remainder being female and data terminals 140 then being the opposite. Along these lines, terminal block 136 could have key(s) 122 with terminal block 118 then having keyway(s) 142. Also, terminal block 118 could have one or more key(s) 122 and one or more keyway(s) 142, with terminal block 136 then having corresponding keyway(s) 142 and key(s) 122.

In the embodiment of FIGS. 1A and 1B, retention member 128 illustratively includes an inwardly projecting flange or lip 144 that extends at least partially across battery pack 104. Retention member 128 may illustratively be formed as an integral part of upper rear 130 of battery pack 104 or may be a separate member, such as a dowel pin, that is affixed to upper rear 130 of battery pack 104.

In the embodiment of FIGS. 1A and 1B, latch 132 includes a hook member 146. Hook member 146 may illustratively include a vertical (as oriented in FIG. 1A) member 148 extending at least partially across battery pack 104 having a flange or lip 150 at an upper end 152. A lower end 154 of vertical member 148 is pivotally mounted to battery pack 104. Latch 132 further includes an actuator member 156 that extends from vertical member 148 out the front of battery pack 104. Actuator member 156 illustratively extends from a 149 of vertical member 148 that is between lower end 154 of vertical member 148 and upper end 152 of vertical member 148. A spring 158 is disposed in battery pack 104 to urge latch 136 to the latched position. In the embodiment shown in FIGS. 1A and 1B, spring 158 extends between terminal block 136 and a side 160 of vertical member 148 of hook member 146 that is opposite a side 162 of vertical member 148 from which actuator member 156 extends.

Battery pack 104 also includes battery cells 164 as is conventional. Battery pack 104 may also include controller 126 and fan 166.

Interface system 100 interfaces cordless power tool 102 and battery pack 104 together as follows. When battery pack 104 is mated with cordless power tool 102, rear lip 112 at the rear end 110 of foot 108 of tool housing 106 is placed under lip 144 of retention member 128 at the upper rear 130 of battery pack 104. Retention member 128 and rear lip 112 of rear end 110 of foot 108 of tool housing 106 provide a pivot 113 (FIG. 1C) about which battery pack 104 and cordless power tool 102 rotate with respect to each other. Battery pack 104 is then rotated upwardly (as oriented in FIG. 1A) until latch 132 engages front lip 114 at the front of foot 108 of tool housing 106. In the embodiment shown in FIGS. 1A and 1B, lip 150 of hook member 146 of latch 132 engages inwardly projecting front lip 114 of tool housing 106. Hook member 146 compresses spring 158 as lip 150 of hook member 146 passes over front lip 114. Spring 158 urges hook member 146 toward front lip 114 maintaining lip 150 of hook member 146 engaged with front lip 114 of tool housing 106. Rear lip 112 of tool housing 106 engaging retention member 128 of battery pack 104 and latch 132 of battery pack 104 engaging front lip 114 of tool housing 106 retain battery pack 104 in cordless power tool 102.

Figure 1C:
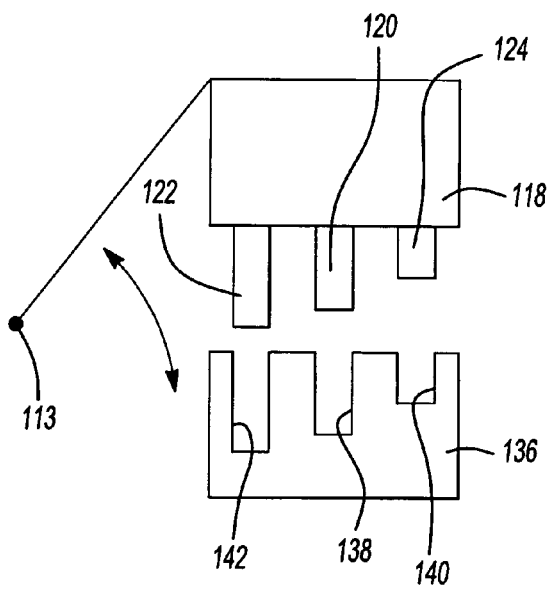
FIG. 1C is a schematic view of the terminal blocks of FIGS. 1A and 1B as they are mated together.

Power terminals 120, key(s) 122 and data terminals 124 of terminal block 118 of cordless power tool 102 may illustratively be staggered as shown in FIGS. 1C. As battery pack 104 is pivoted up into cordless power tool 102, key(s) 122 engage the respective keyway(s) 142 of terminal block 136 of battery pack 104 first to align terminal block 118 and terminal block 136. Power terminals 120, since they are typically larger, more robust terminals than data terminals 124, next engage power terminals 138 of terminal block 136, further aligning terminal block 118 and terminal block 136. Data terminals 124 of terminal block 118 then engage data terminals 140 of terminal block 136.

It should be understood that key(s) 122 and keyway(s) 142 could be dispensed with and the alignment function achieved by the staggered relationship between power terminals 120 and data terminals 124. When battery pack 104 is pivoted into cordless power tool 102, power terminals 120 of terminal block 118 would first engage power terminals 138 of terminal block 136, with data terminals 124 of terminal block 118 subsequently engaging data terminals 140 of terminal block 136. The engagement of the more robust power terminals 120 in terminal block 118 to power terminals 138 in terminal block 136 aligns terminals blocks 118, 136 before data terminals 124 of terminal block 118 engage data terminals 140 of terminal block 136, helping prevent any damage to the less robust data terminals 124 due to terminal blocks 118, 136 being misaligned when data terminals 124 of terminal block 118 engage data terminals 140 of terminal block 136.

In an aspect of the invention, key(s) 122 may illustratively be spring loaded or a separate spring loaded ejector pin(s) 170 provided in one of terminal blocks 118, 136 with a corresponding receptacle 172 in the other terminal block 118, 136, as shown in FIG. 1D. The spring loaded key(s) 122 or spring loaded ejector pin 170 would urge the terminal blocks 118, 136 apart when latch 132 is released, aiding the ejection and removal of battery pack 104 from cordless power tool 102. The spring aided ejection would make ejection of battery pack 104 more consistent even should interface system 100 become contaminated, such as with dirt or other contaminants. The cooperation of spring loaded ejector pin 170 and receptacle 172 would align terminal blocks 118, 136 during insertion of battery pack 104 into cordless power tool 102 in the same manner as discussed above. It should be understood that each of terminal blocks 118 and 136 could have one or more spring loaded ejector pin 170 with the other terminal block 118, 136 having corresponding receptacles 172. It should also be understood that spring loaded ejector pin(s) 170 could be used without a corresponding receptacle 172 in the other terminal block 118, 136 if the alignment function provided by spring loaded ejector pin(s) 170 engaging receptacle(s) 172 isn't needed, or this alignment function is provided by key(s) 122 and keyway(s) 142. It should also be understood that the body 176 of the terminal block 118 and/or the body 178 of the terminal block 136 could be spring loaded to provide the same eject function without spring loaded ejector pins or keys.

In an aspect of the invention, the female power and data terminals, which are illustratively power terminals 138 and data terminals 140 of terminal block 136 have open sides 174, 176, respectively, opposite the sides in which the male power terminals 120 and data terminals 124 are inserted. These open sides allow debris and other contaminants that might get in the female terminals to fall or be pushed out.

In an aspect of the invention, by having the male and female power and data terminals in terminal blocks 118 and 136 received in slots that closely conform to them, the terminals are supported so that commercially available crimp-on terminals may illustratively be used. For example, an AMP brand terminal 794974 available from Tyco Electronics (AMP) of Harrisburg, Pa. could be used for the male power terminals, an AMP brand terminal 61626-1 used for the female power terminals, an AMP brand terminal 350654-1 used for the male data terminals and an AMP brand terminal 30536-1 used for the female data terminals.

In the embodiment shown in FIGS. 1A and 1B, one latch 132 and corresponding front lip 114 of tool housing 106 are used which are centered in battery pack 104 (when viewed from the top as best seen in FIG. 1B). It should be understood that a plurality of latches 132 and corresponding front lips 114 could be used. For example, if two latches 132 were used, they would illustratively be located on either side of battery pack 104 (again as viewed from the top). Front lip 114 may then be a single lip 114 that extends across the battery pack or two lips 114 disposed in tool housing 106 opposite the respective hook members 146 of the two latches 132. While the embodiment shown in FIGS. 1A and 1B has been described with latch 132 at the front of the battery pack 104 and retention member 128 at the rear, it should be understood that latch 132 could be at the rear of battery pack 104 and the retention member 128 at the front. In this case, the lips that may be rear and front retention members 112, 114 of tool housing 106 would similarly be located at the front and rear of tool housing 106, respectively.

Terminal blocks 118, 136 may illustratively be disposed in cordless power tool 102 and battery pack 104 so that terminal block 136 is between the pivot point 113 where rear retention member 112 of tool housing 106 pivots about retention member 128 of battery pack 104 and latch area 133 defined by front retention member 114 and latch 132, and preferably as close as possible to this latch area 133. Having the terminal blocks as close as possible to the latch area 133 minimizes misalignment. Also, the further the terminal blocks are from the pivot point 113, the straighter the path that the terminal blocks will take with respect to each other when battery pack 104 is inserted into cordless power tool 102. This could be facilitated by placing terminal blocks forward of the latches to further move them from the pivot point. Terminal blocks 118, 136 may illustratively be made of electrically non-conductive plastic.

In an aspect of the invention as can best be seen in FIG. 1C, when key(s) and keyway(s) 142 are provided in the terminal blocks, such as key(s) 122 in terminal block 118 and keyway(s) 142 in terminal block 136, the key(s) and keyway(s) are positioned so that they are closet to the pivot point 113. This helps ensure that the key(s) and keyway(s) mate first. The data terminals would illustratively be furthest away from the pivot point 113, helping ensure that they mate last, with the power terminals between the key(s)/keyway(s) and the data terminals.

Figure 2B:
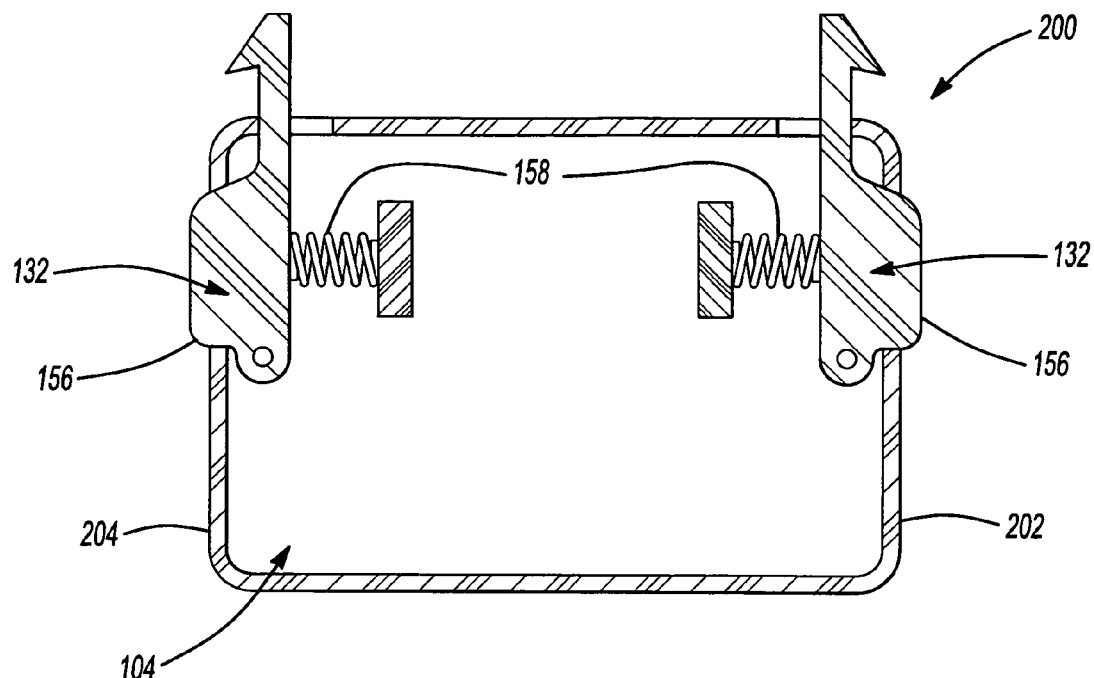
FIG. 2B is a cross-sectional view of the battery pack of FIG. 2A taken along the line 2B—2B of FIG. 2A.

FIGS. 2A and 2B show a variation of interface system 100 shown in FIGS. 1A and 1B. Common elements will be identified with the same reference numerals and the discussion will focus on the differences. In the interface system shown in FIGS. 2A and 2B, latches 132 are disposed so that they extend out the sides 202, 204 of battery pack 104, at generally the front of battery pack 104, as opposed to out the front 134 of battery pack 104. Corresponding retention members 114 (such as lips) are then disposed on sides of tool housing 106 generally at the front of tool housing 106 and actuator members 156 project out through sides 202, 204 of battery pack 104. Disposing latches in battery pack 104 so that actuator members 156 in particular project out the sides of battery pack 104 puts actuator members 156 in a more natural grip position as well as distributing the weight of the battery pack 104 on the latches 132 more evenly.

Figure 3A:
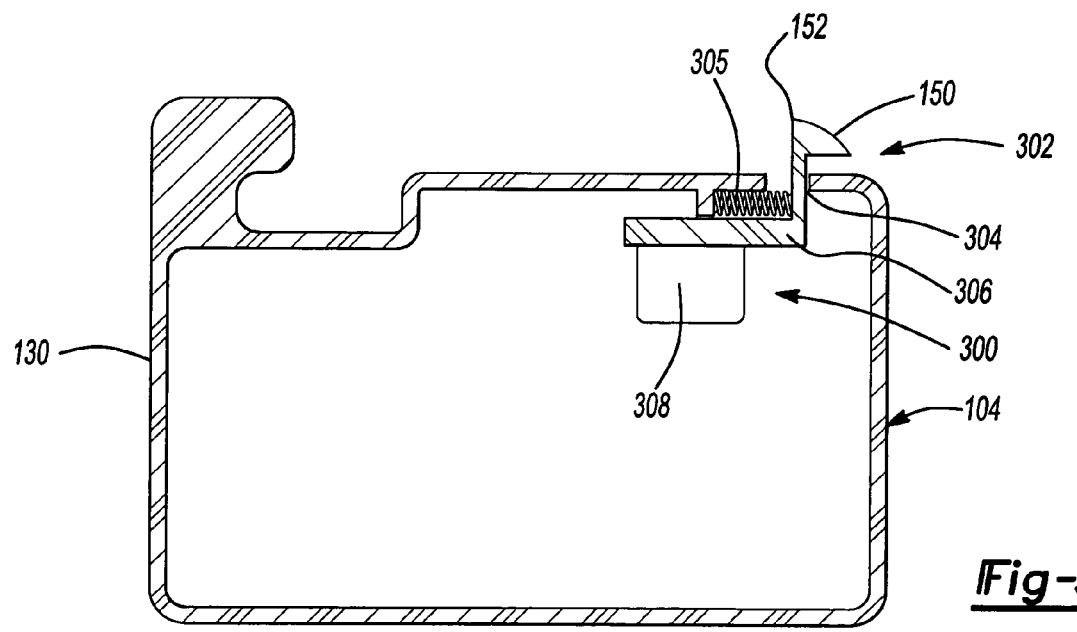
FIG. 3A is a side cross-sectional view of the battery pack of FIGS. 1A and 1B with a variation of the latch.
Figure 3B:
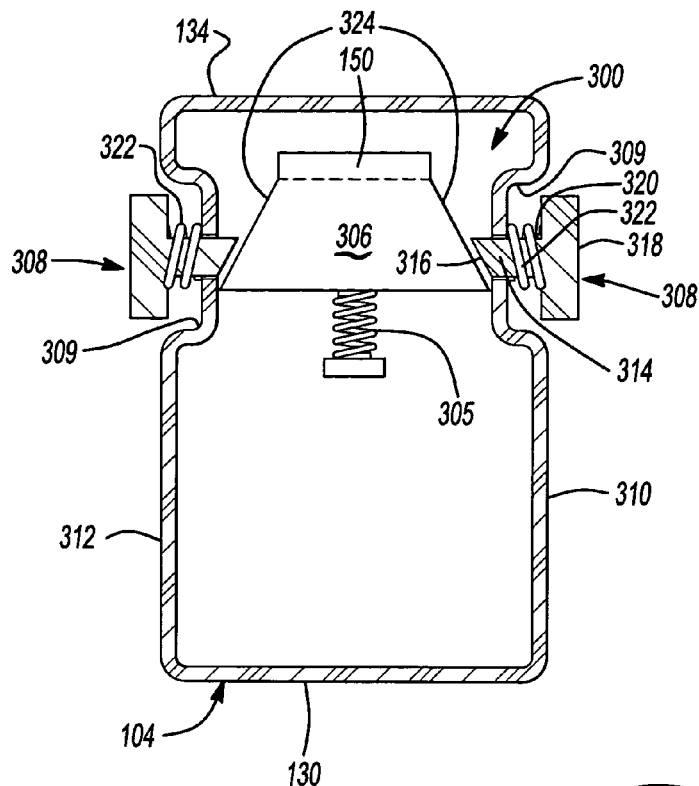
FIG. 3B is a top cross-sectional view of the battery pack of FIG. 3A.
Figure 4A:
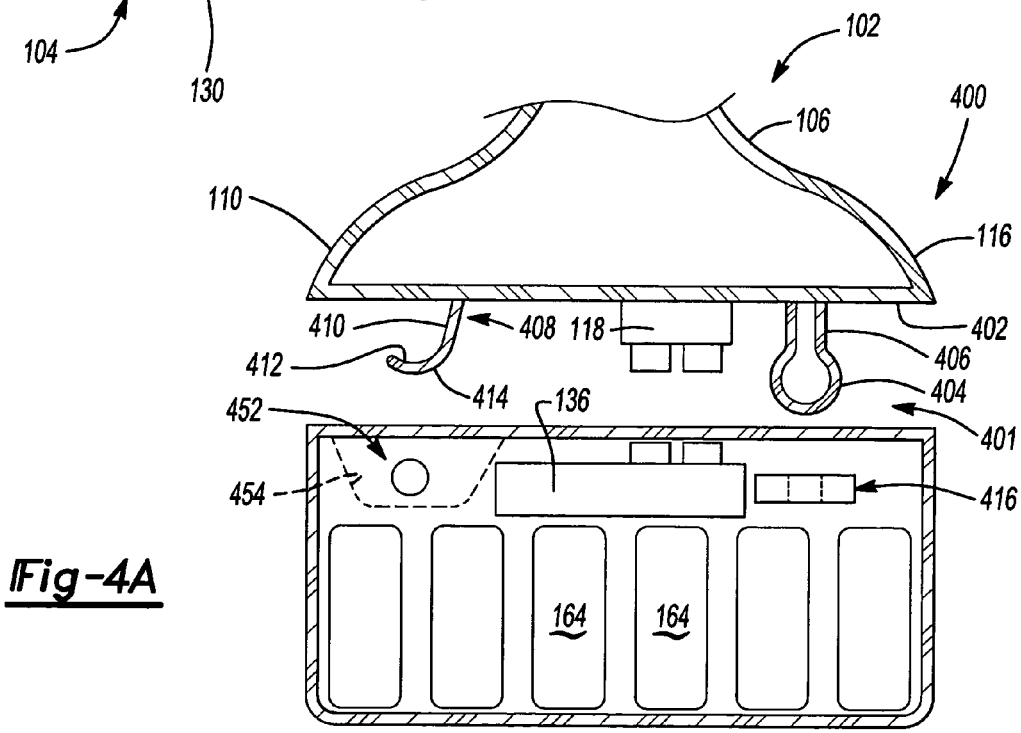
FIG. 4A is a side cross-sectional view of an interface system for a cordless power tool and battery pack in accordance with an embodiment of the invention having a "trailer hitch" type of latching system.
Figure 4B:
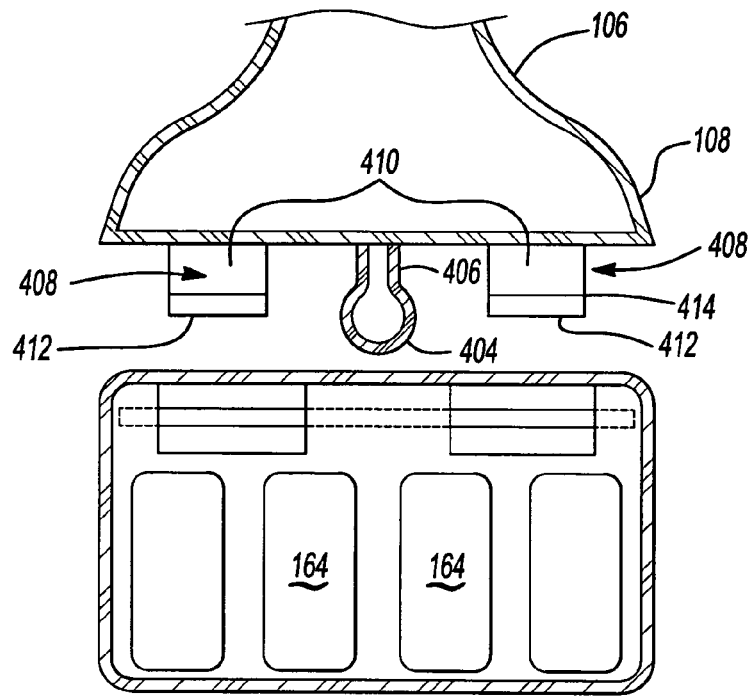
FIG. 4B is a rear cross-sectional view of the interface system of FIG. 4A.
Figure 4C:
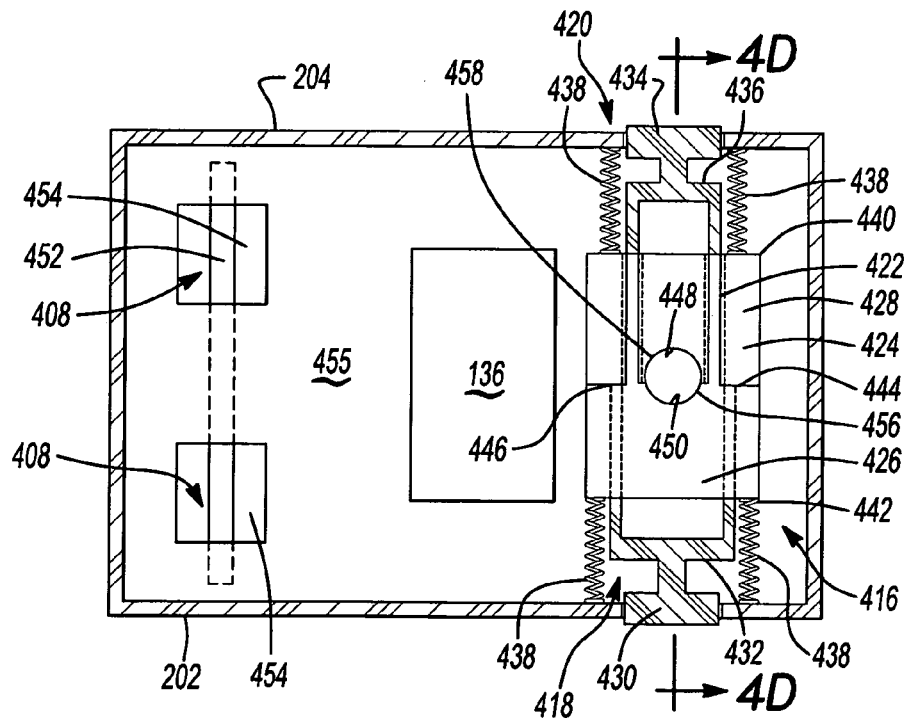
FIG. 4C is a top cross-sectional view of the interface system of FIG. 4A.
Figure 4D:
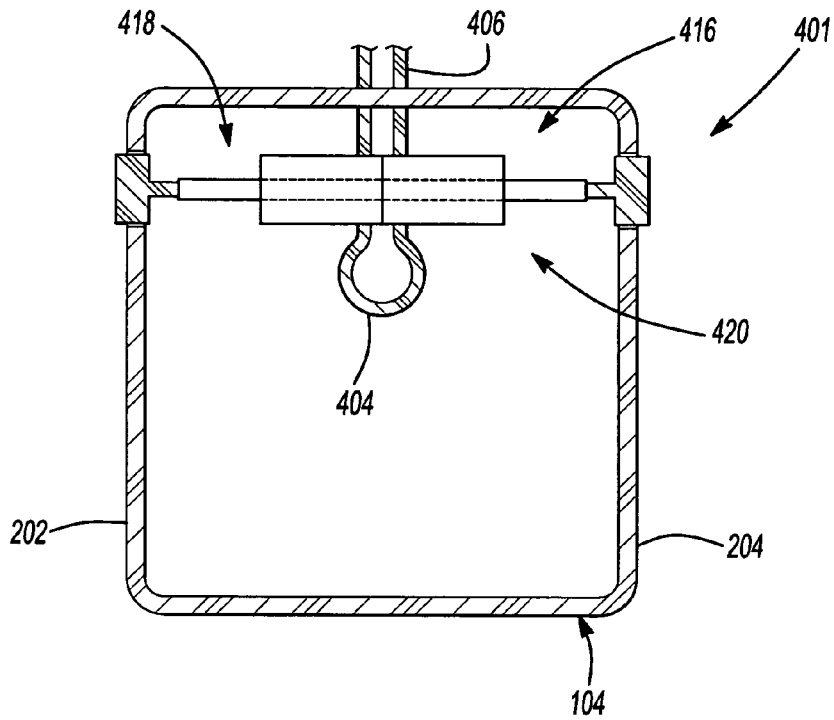
FIG. 4D is cross-sectional view taken along the line 4D—4D of FIG. 4C.
Figure 5A:
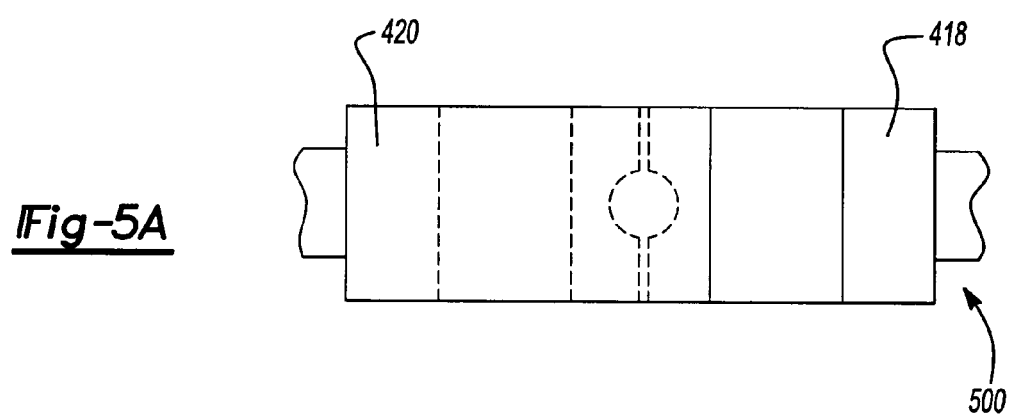
FIGS. 5A–5B are views of an alternative "trailer-hitch" type latch system of FIGS. 4A–4D.
Figure 5B:
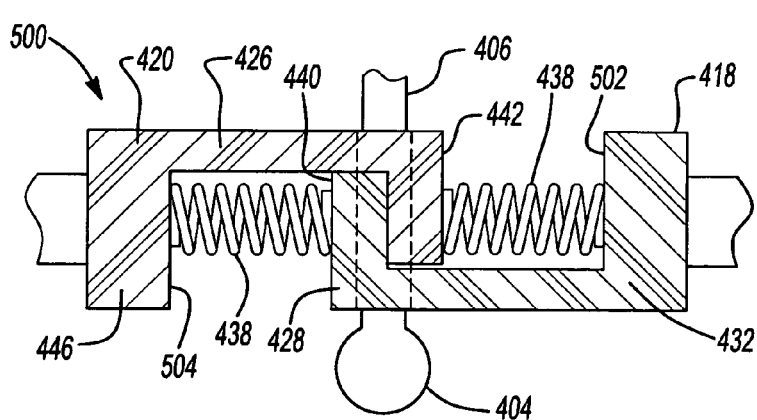
Figure 5C:
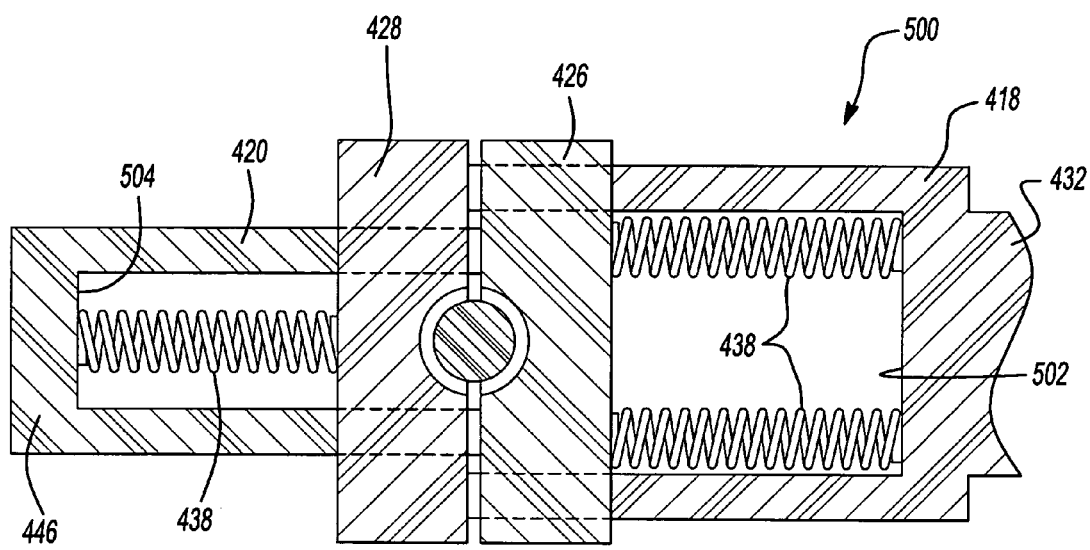
FIGS. 5C–5D are views of a second alternate "trailer-hitch" type latch systems of FIGS. 4A–4D.
Figure 5D:
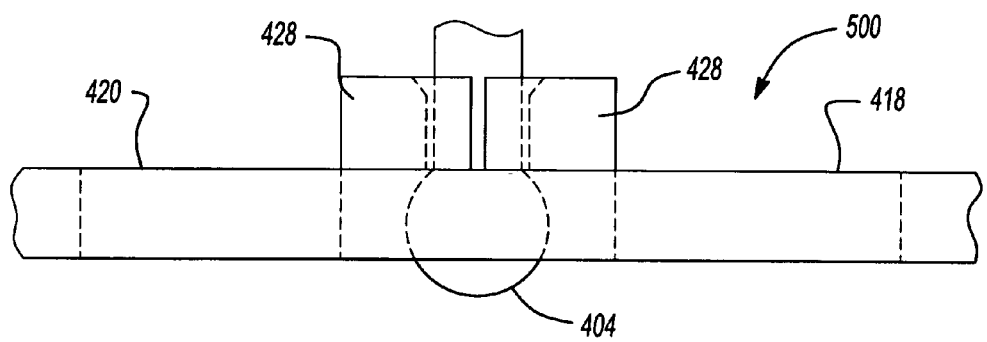

FIGS. 3A and 3B show a latch 300 that is an alternative to latch 132. Common elements will be identified with the same reference numerals and the discussion will focus on the differences. Latch 300 includes hook member 302 having a vertical (as oriented in FIG. 3A) member 304 and a horizontal member 306. Vertical member 304 includes outwardly extending lip 150 at upper end 152. Horizontal member 306 has a trapezoidal shape when viewed from above as shown in FIG. 3B with tapered sides 324. A spring 305 is disposed in battery pack 104 so as to contact vertical member 304 and urge hook member 302 toward its latched position where lip 150 engages front retention member 114 of tool housing 106 (FIG. 1A). Latch 300 also includes actuator members 308 disposed in recesses 309 in opposed sides 310, 312 of battery pack 104. Each actuator member 308 includes a shaft 314 having a tapered distal end 316 and a button 318 at an end 320 of shaft 314 opposite tapered distal end 316. A spring 322 is disposed around each shaft 314 between button 318 and the respective side 310, 312 of battery pack 104 to urge actuator members 308 outwardly away from horizontal member 306 of hook member 302 of latch 300.

In operation, as discussed, spring 305 urges hook member 302 of latch 300 to the latched position. To unlatch latch 300, buttons 318 of actuator members 308 are depressed. Tapered distal ends 316 of shaft 314 of actuator members 308 contact the tapered sides 324 of the trapezoidal shaped horizontal member 306, urging horizontal member 306 toward the rear 130 of battery pack 104, thus moving lip 150 out of engagement with retention member 114 of tool housing 106 (FIG. 1A). Placing actuator members 308 in the sides 310, 312 of battery pack 104 positions them in a more natural grip position, as discussed above with respect to the interface system shown in FIGS. 2A and 2B.

FIGS. 4A–4D show an alternate interface system 400. Elements that are common with the elements of interface system 100 shown in FIGS. 1A and 1B will be identified with the same reference numerals and the discussion will focus on the differences.

Interface system 400 utilizes a "trailer hitch" style of latch system 401. Latch system 401 includes a ball 404 that extends from a bottom 402 of foot 108 of tool housing 106 of cordless power tool 102 generally at front 116 of tool housing 106. Ball 404 may illustratively be disposed at the end of a shaft 406 that extends from bottom 402 of foot 108 of tool housing 106. Latch system 401 also includes a latch 416 disposed in battery pack 104 to capture ball 404 when battery pack 104 is placed in cordless power tool 102. Latch 416 may illustratively include an outer sleeve 418 that extends laterally across at least a portion of battery pack 104 from side 202 and an inner sleeve 420 that extends laterally across at least a portion of battery pack 104 from opposite side 204 of battery pack 104. A distal portion 422 of inner sleeve 420 is received in a distal portion 424 of outer sleeve 418. Distal portion 422 of inner sleeve 420 includes a distal end member 426 that extends transversely across inner sleeve 420 and distal portion 424 of outer sleeve 418 includes a distal end member 428 that extends transversely across outer sleeve 418. Outer sleeve 418 includes an actuator member 430 extending outwardly through side 202 of battery pack 104 from a proximal end 432 of outer sleeve 418. Inner sleeve 420 includes an actuator member 434 extending outwardly through side 204 of battery pack 104 from a proximal end 436 of inner sleeve 420. Springs 438 are disposed between a distal end 440 of distal end member 428 of outer sleeve 418 and side 204 of battery pack 104. Springs 438 are also disposed between a distal end 442 of distal end member 426 of inner sleeve 420 and side 202 of battery pack 104. Proximal ends 444, 446 of distal end members 426, 428 of inner and outer sleeves 420, 418 may illustratively include recesses 448, 450 at generally their centers that conform to shaft 406. Springs 438 urge the distal end members 426, 428 of inner and outer sleeves 420, 418 together so as to capture shaft 406 therebetween, latching battery pack 104 in cordless power tool 102. Pressing actuator members 430, 434 forces distal end members 428, 426 of outer and inner sleeves 418, 420 apart so that battery pack 104 can be removed from cordless power tool 102.

In the embodiment shown in FIGS. 4A–4D, rear retention member 112 at the rear 110 of foot 108 of tool housing 106 may illustratively be replaced by two retention members 408. Each retention member 408 may illustratively be a hook member that extends downwardly and outwardly from bottom 402 of foot 108 of tool housing 106. The hook member may illustratively have a generally vertical member 410 that extends generally downwardly (as oriented in FIGS. 4A and 4B) from bottom 402 of foot 108 of tool housing 106 and an outwardly extending lip 412 at a distal end 414.

Retention member 128 of battery pack 104 is illustratively replaced by a rod 452, such as a steel dowel, that extends transversely across battery pack 104 through at least one upwardly opening recess 454 in a top 455 of battery pack 104. Recess 454 may illustratively extend across battery pack 104 to permit both retention members 408 to be received therein, or battery pack 104 have a recess 454 for each retention member 408.

When battery pack 104 is inserted into cordless power tool 102, retention members 408 are first inserted in recess (s) 454 in the top 455 of battery pack 104 so that lips 412 of retention members 408 are inserted under rod 452. Battery pack 104 and cordless power tool 102 are then rotated together. Actuator members 430, 434 are pressed, opening latch 416 so that ball 404 can pass through latch 416. Actuator members 430, 434 are then released and latch 416 captures shaft 406 to secure battery pack 104 and cordless power tool 102 together. It should be understood that top edges 456, 458 of proximal ends 444, 446, respectively, of distal end members 426, 428 of inner and outer sleeves 420, 418 can be beveled about recesses 448, 450 to allow the latch 416 to be opened by ball 404 as it passes through recesses 448, 450.

Referring to FIGS. 5A–5D, a variation 500 of latch 416 is shown. Common elements will be identified with the same reference numerals and the discussion will focus on the differences. In latch 500, one or more springs 438 are disposed between distal end 442 of distal end member 426 of inner sleeve 420 and an inwardly facing surface 502 of proximal end 432 of outer sleeve 418. Alternatively or additionally, one or more springs 438 are disposed between distal end 440 of distal end member 428 of outer sleeve 418 and an inwardly facing surface 504 of proximal end 446 of inner sleeve 420.

While the foregoing trailer hitch style latch system has been described with cordless power tool 102 having ball 404 and battery pack 104 having latch 416, it should be understood that cordless power tool 102 can have the latch and battery pack 104 can have the ball.

Figure 6A:
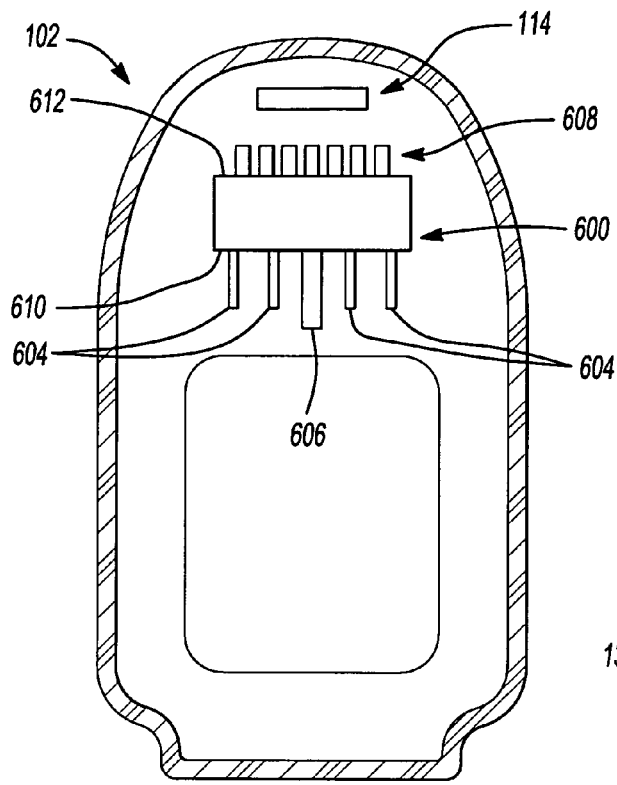
FIG. 6A is a bottom view of a cordless power tool having an alternative terminal block in accordance with an aspect of the invention.
Figure 6B:
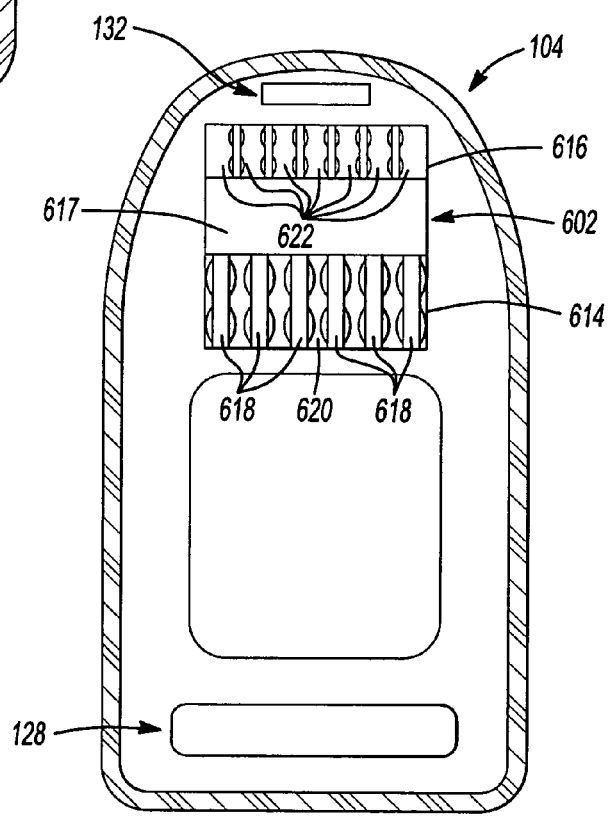
FIG. 6B is a top view of a battery pack having an alternative terminal block in accordance with an aspect of the invention.

FIGS. 6A–6B show a variation of terminal blocks 118, 136 of the embodiments of FIGS. 1A–1D. Common elements will be identified with the same reference numerals and the discussion will focus on the differences. FIG. 6A is a bottom view of cordless power tool 102 and FIG. 6B is a top view of battery pack 104. Cordless power tool 102 includes terminal block 600 and battery pack 104 includes corresponding terminal block 602. It should be understood, however, that terminal block 600 could be disposed in battery pack 104 with terminal block 602 disposed in cordless power tool 102. Terminal blocks 600, 602 may illustratively be made of electrically non-conductive plastic.

Terminal block 600 includes power terminals 604 and may illustratively include key(s) 606 and data terminals 608. Power terminals 604 and key(s) 606 illustratively extend laterally from one side 610 of terminal block 600 and data terminals 608 extend laterally from an opposite side 612 of terminal block 600.

Terminal block 602 illustratively includes first receptacle block 614 and second receptacle block 616 in spaced relation to first receptacle block 614 defining a recess 617 therebetween. First receptacle block 614 includes power terminals 618 and keyway(s) 620 corresponding to power terminals 604 and key(s) 606 of terminal block 602. Second receptacle block 616 includes data terminals 622 corresponding to data terminals 608 of terminal block 600.

When battery pack 104 and cordless power tool 102 are rotated together, terminal block 600 is received in recess 617 between first and second receptacle blocks 614, 616 of terminal block 602 of battery pack 104. Terminal block 600 and first and second receptacle blocks 614, 616 of terminal block 602 may illustratively be dimensioned so that terminal block 600 is received between first and second receptacle blocks 614, 616 before any of the key(s) or terminals of terminal block 600 begin to mate with the keyway(s) and terminals of terminal block 602 to align terminal block 600 and terminal block 602. Key(s) 606 (if present) of terminal block 600 mating with keyway(s) 620 of terminal block 602 assist in aligning terminal blocks 600, 602, preferably before power terminals 604 and data terminals 608 of terminal block 600 mate with respective power terminals 618 and data terminals 622 of terminal block 602. Power terminals 604 of terminal block 600 next mate with power terminals 618 of terminal block 602 to further align terminal block 600 and terminal block 602 before data terminals 608 of terminal block 600 begin mating with data terminals 622 of terminal block 602. In this regard, key(s) 606, power terminals 604 and data terminals 608 of terminal block 600 may be staggered, with key(s) 606 being the furthest from the bottom of cordless power tool 102 and data terminals 608 being the closest. Also, terminal blocks 600, 602 may illustratively be disposed so that side 610 of terminal block 600 and first receptacle block 614 of terminal block 602 are closest to the pivot point such as pivot point 113 and second side 612 of terminal block 600 and second receptacle block 616 of terminal block 602 are furthest away.

FIGS. 7A–7E show another variation for terminal blocks 118 and 136 of FIGS. 1A and 1B. In terminal block 700, the terminals and key(s) (if key(s) are provided), designated generally by reference numeral 702, have opposed ends secured in opposed block sections 704, 706 of terminal block 700 that are in spaced relation so that the terminals and keys bridge a gap or recess 708 defined by opposed block sections 704, 706. Terminal block 700 may illustratively be a U-shaped block with a bight section 710 extending between opposed block sections 704, 706. Opposed block sections 704, 706 and bight section 710 may illustratively be made of electrically non-conductive plastic.

Figure 7D:
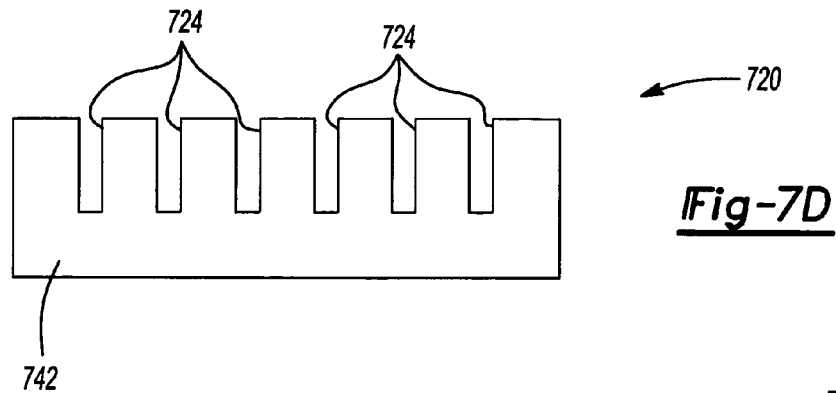
FIG. 7D is a side view of the terminal block of FIG. 7C.
Figure 7E:
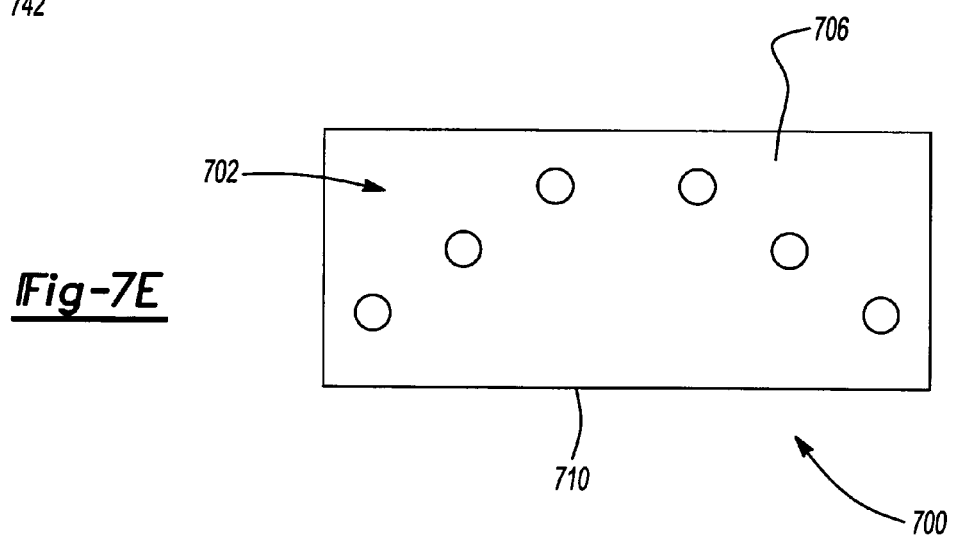
FIG. 7E is a cross sectional view taken along the line 7E—7E of FIG. 7A.

A corresponding terminal block 720, shown in FIGS. 7C and 7D has a block shaped body 722 having receptacles 724 for receiving terminals and defining keyway(s), defined generally by reference numeral 726. Terminal block 700 may illustratively be disposed in cordless power tool 102 and terminal block 720 disposed in battery pack 104. Alternatively, terminal block 700 may be disposed in battery pack 104 and terminal block 720 disposed in cordless power tool 102. Terminal blocks 700, 720 may illustratively be made of electrically non-conductive plastic. Terminals and key(s) may illustratively be staggered in terminal block 700 (as shown in FIG. 7E) with the key(s) being furthest from bight section 710 and the data terminals being closest, with terminal block 720 being formed so that as terminal blocks 700, 720 are mated together, the key(s) of terminal block 700 first mate with the keyway(s) of terminal block 720, the power terminals of terminal blocks 700, 720 next mate with the data terminals of the terminals blocks 700, 720 being the last to mate. This facilitates alignment of terminal blocks 700, 720 before the power terminals mate, the mating of the power terminals further facilitating alignment of the terminal blocks 700, 720 before the data terminals mate.

Figure 8A:
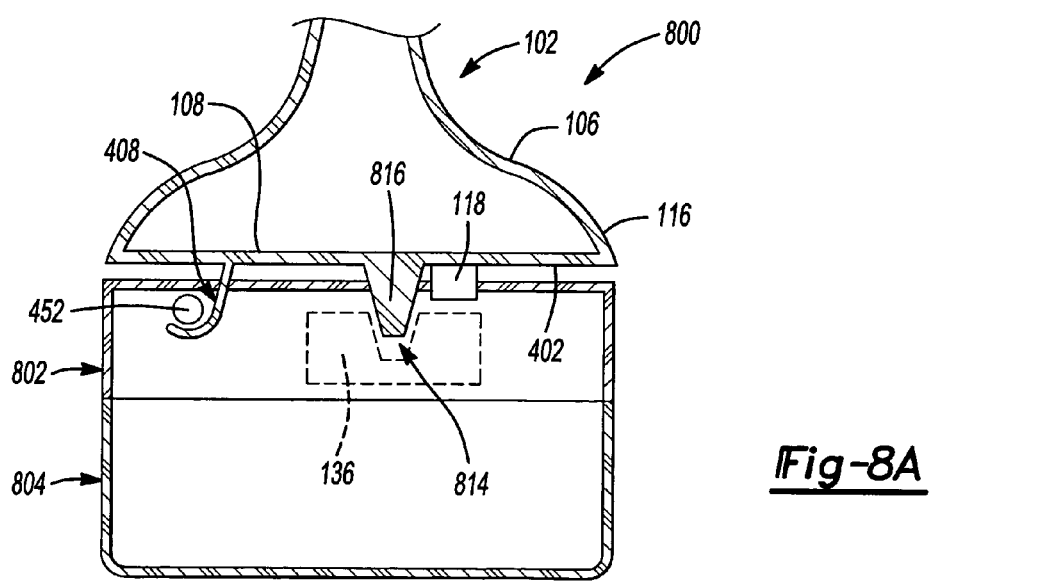
FIG. 8A is a side perspective view of an interface system for a cordless power tool and battery pack having a modular interface section in accordance with an aspect of the invention.
Figure 8B:
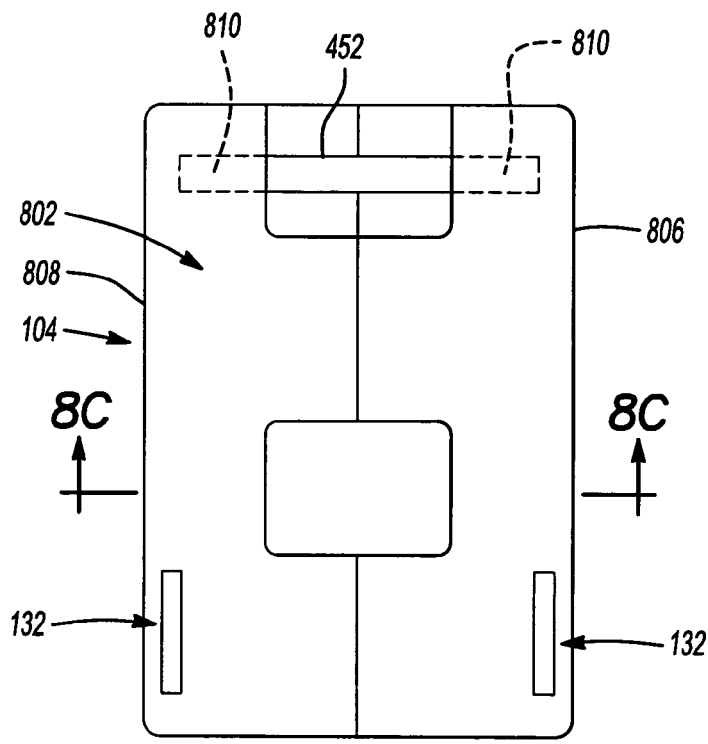
FIG. 8B is a top view of the battery pack of FIG. 8A.
Figure 8C:
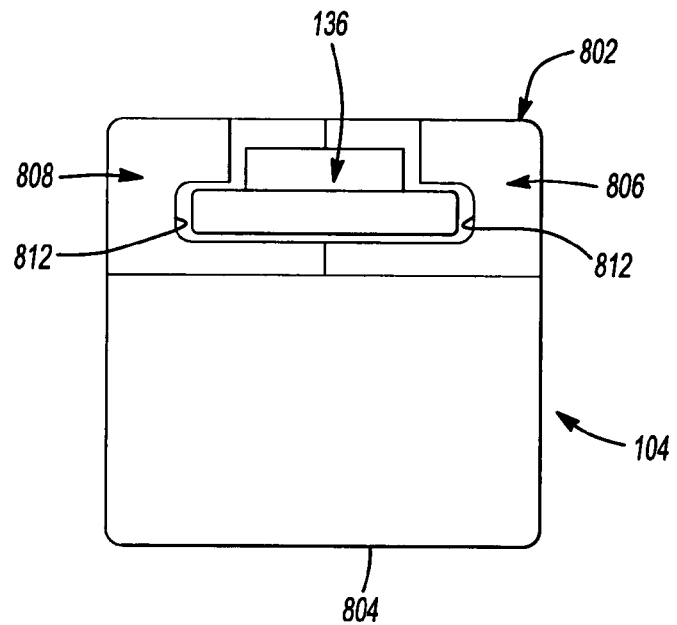
FIG. 8C is a cross-sectional view taken along the line 8C—8C of FIG. 8B.

FIGS. 8A–8C show an interface system 800 that is a variation of interface systems 100 and 400. Common elements will be identified with the same reference numerals and the discussion will focus on the differences. One principal difference is that interface system 800 uses a modular approach where a modular interface section 802 on the battery pack 104 remains the same for different battery voltages and styles. This modular interface section 802 is then mated with different battery cups 804 to provide a consistent interface and footprint with the various cordless power tools with which it is used, such as cordless power tool 102.

Using the modular interface approach provided by modular interface section 802 across all cordless power tools and battery voltages/configurations would likely significantly reduce tooling costs as the same parts would be used for the modular interface section 802 regardless of the battery voltage/configuration of the battery cup 804. Any voltage/configuration of battery cup 804 could be attached to modular interface section 802 and have a pre-designed interface connection to the tool(s). This flexibility to use any voltage/configuration of battery cup 804 with modular interface section 802 provides for the use of various types of cell chemistries in various form factors.

By having all cordless power tools and battery packs in all cordless power tool product lines use the same modular interface approach, such as using modular interface section 802 with all the battery packs, cordless power tools could be built that could accept any voltage or battery cell chemistry, with the voltage then being regulated to the appropriate level. The cordless power tool and/or battery pack would then illustratively include electronics to regulate the voltage of the motor used in the cordless power tool. This would allow cordless power tool users to "mix and match" any of the battery packs having modular interface section 802 with any of the cordless power tools configured to interface with modular interface section 802. The user would thus have the ability to optimize combinations of cordless power tools and battery packs for their preferred run time, power, weight, etc.

Figure 9A:
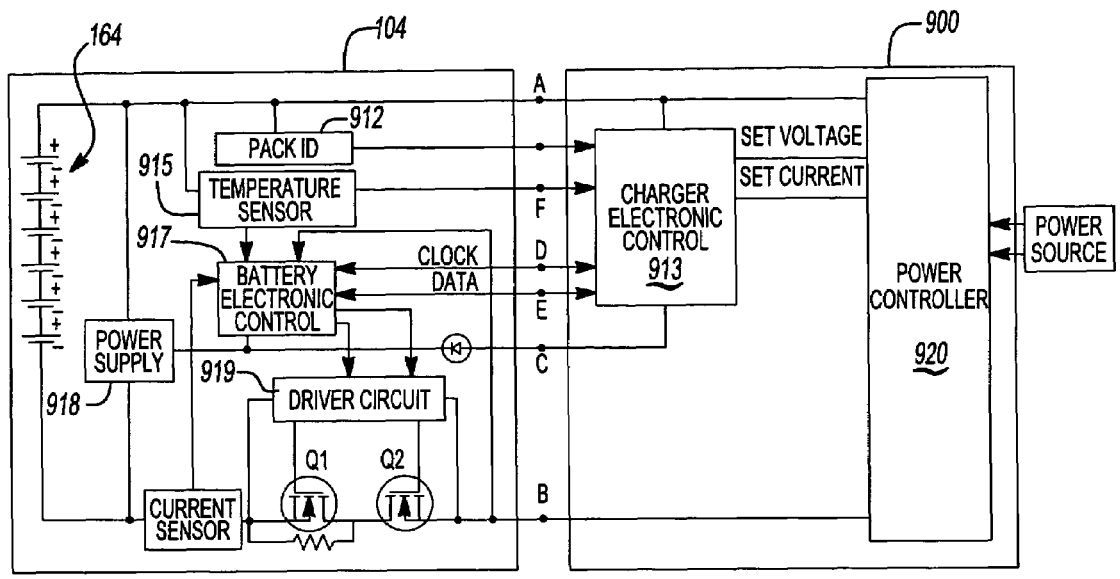
FIG. 9A is a schematic system diagram of the functional control of a battery pack and battery charger.

This is described in greater detail with reference to FIGS. 9A–9C. FIG. 9A shows a battery pack 104 (which illustratively has modular interface section 802) coupled to a charger 900. The plurality of battery cells 164 are interconnected to provide the desired voltage and current. The power connections for charging and discharging the battery pack 104 are through terminals A and B. Inside the battery pack 104 there is a pack ID component 912 which, when used with the charger 900 or cordless power tool 102 (FIG. 9B), can define the chemistry of battery cells 164, capacity of battery pack 104, and/or other characteristics to either the charger's electronic control unit 913 or the cordless power tool 102 electronic control unit 914 (FIG. 1B). Battery pack 104 may also have one or more temperature sensors (such as a thermistor) 915 connected to both the charger unit via terminal F and an electronic control unit 917 inside the battery pack 104. The electronic control unit 917 may illustratively be responsible for the protection of the cells 164 for any condition exposed on the terminals A, B by the user (charger, tool, and/or user tampering). The discharge or charge current can be clamped or discontinued by the use of semi-conductor devices Q1 and Q2, which are illustratively MOSFETs. The electronic control unit 917 may illustratively be powered by a separate power supply, such as internal power supply 918. A driver circuit 919 may illustratively be disposed between electronic control unit 917 and control inputs of semi-conductor devices Q1, Q2.

When connected to a charger 900, the charger electronic control unit 913 can be powered from the battery pack 104's power supply 918 through terminals A and C. This is only exemplary as other means for powering the charger electronic control unit 913 can be employed. Battery and charger information can be exchanged via data terminals D and E. The charger electronic control unit 913 then will drive power controller 920 of charger 900 to deliver the desired voltage and current to the battery pack 104. It should be understood that terminals A–F may illustratively be appropriate power terminals 138 and data terminals 140 of terminal block 136 of battery pack 104 and corresponding power and data terminals of a terminal block (not shown) of charger 900.

Figure 9B:
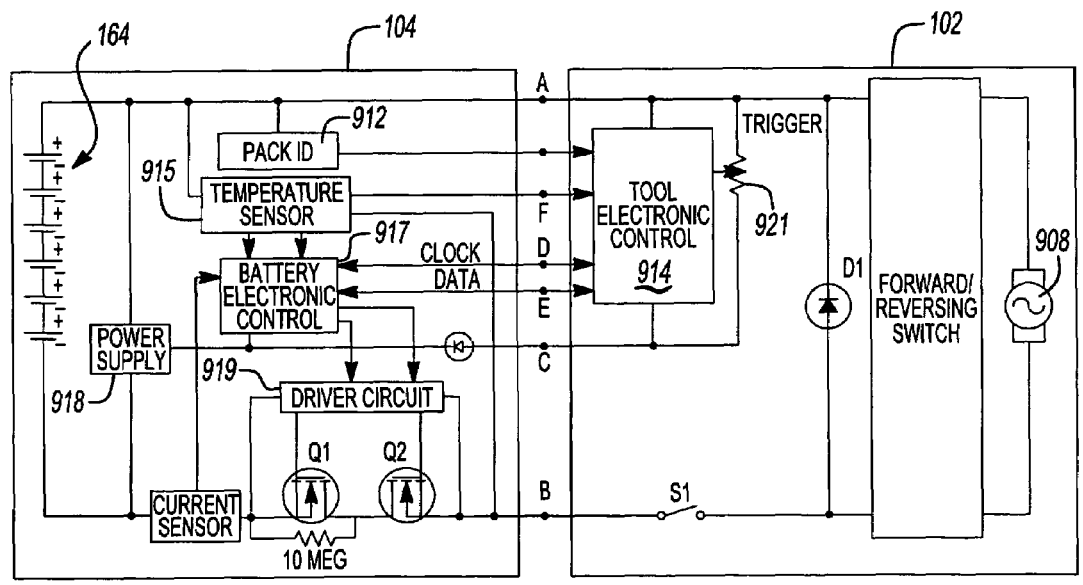
FIG. 9B is a schematic system diagram of the functional control of a battery pack and tool according to an aspect of the invention.

With reference to FIG. 9B, the battery pack 104 is shown connected to a cordless power tool 102, which may illustratively be a smart tool having an electronic control unit 914. Electronic control unit 914 can be powered from the battery pack 104 power supply 918 through terminals A and C. The cordless power tool 102 may contain a switch S1 that pulls terminal B high when the semi-conductor Q1 is off. If semi-conductor Q1 is left off while the battery pack 104 is dormant, and suddenly the switch S1 is pulled, terminal B could be used to wake the battery pack 104 from a dormant mode of operation. The tool electronic control unit 914 could be configured to read the trigger switch 921 position and report that data back to the battery pack 104 electronic control unit 917 through data terminals D and E. The battery pack 104 electronic control unit 917 will vary the PWM duty cycle of the power supplied to motor 908 of cordless power tool 102 through semi-conductor Q1 to power motor 908 at a desired motor speed. While semi-conductor Q1 is off, the diode D1 in cordless power tool 102 will re-circulate any inductive motor current to prevent voltage spikes. It should be understood that semi-conductor Q1 could alternatively be included in the cordless power tool 102 and controlled by tool electronic control unit 914 to vary the PWM duty cycle.

Figure 9C:
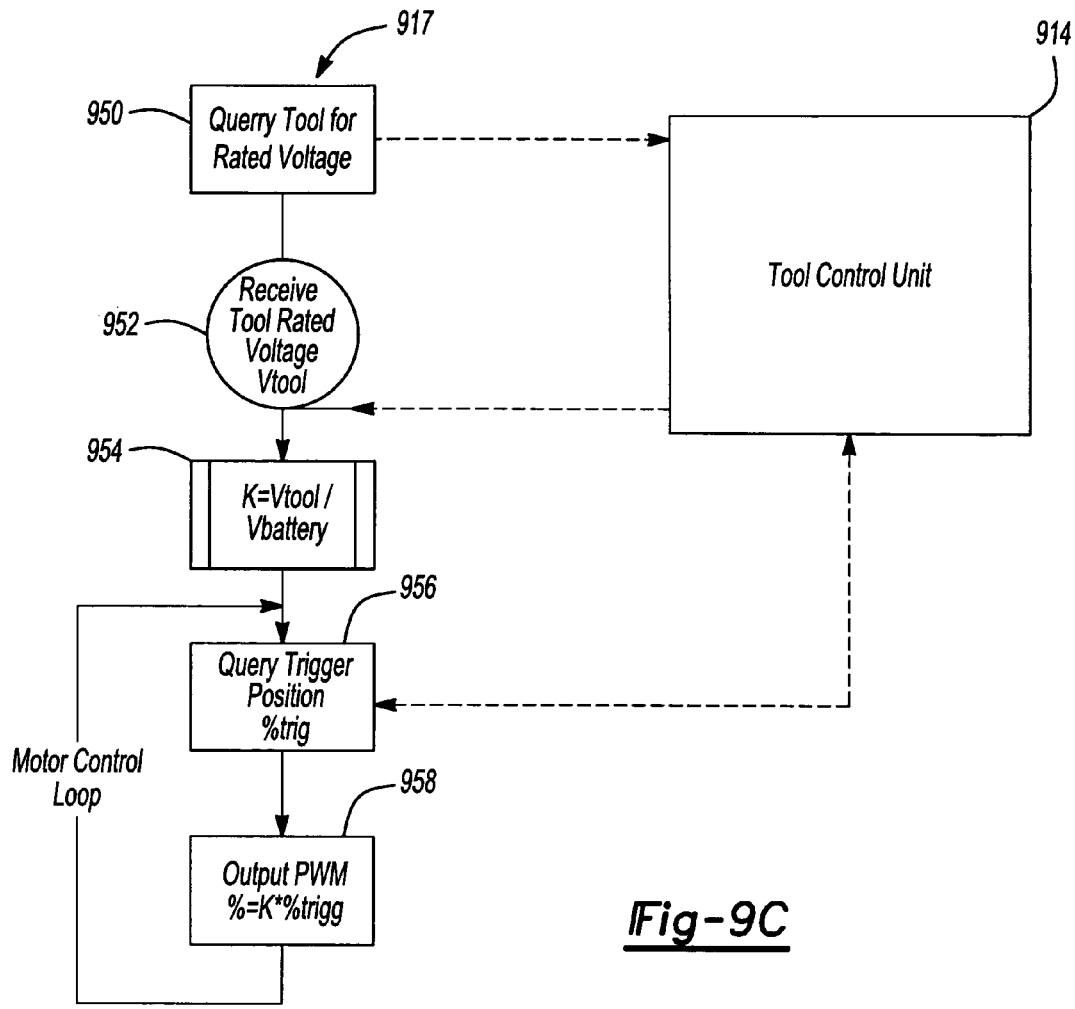
FIG. 9C is a flow chart showing regulation of the motor voltage of the cordless power tool of FIG. 9B.

FIG. 9C is a flow chart showing the regulation of the voltage of motor 908 of cordless power tool 102. At step 950, battery pack 104 electronic control unit 917 obtains information about the rated voltage of the motor 908, such as by querying tool electronic control unit 914 for information about the rated voltage of the motor. This information is transmitted by tool electronic control unit 914 and received by battery pack electronic control unit 917 at step 952. It should be understood that the particular manner that the rated voltage of the motor is obtained by battery pack electronic control 917 is not important. Other ways in which battery pack electronic control unit 917 could obtain this information include reading a code, such as a resistance, in cordless power tool 102 where the code is indicative of the rated voltage of the motor 908.

At step 954, battery pack electronic control unit 917 determines a coefficient K that is the ratio of the rated voltage of the motor 908 to the rated voltage of battery pack 104. In a variation, the coefficient K is the ratio of the rated voltage of the motor 908 to the actual voltage of battery pack 104. At step 956, battery pack electronic control unit 917 obtains the position of trigger switch 921 from cordless power tool 102, such as from tool electronic control unit 914, which is shown in the FIG. 9C as a percentage of how closed the trigger switch 921 is. It should be understood that the particular manner that battery pack electronic control unit 917 obtains the information about the position of trigger switch 921 is not important. For example, the trigger switch 921 may have a potentiometer (as is conventional) and the wiper of this potentiometer coupled to battery pack electronic control unit 917 through terminals of terminal blocks 118, 136 (FIG. 1) which battery pack electronic control unit 917 would then use to determine the position of trigger switch 921.

At step 958, battery pack electronic control unit 917 outputs the PWM control signal to semi-conductor Q1 having a duty cycle determined by multiplying the coefficient K by the trigger switch position percentage. As can be seen, if the trigger switch is fully closed (having a position percentage of 100%) the duty cycle of the PWM control signal will be the coefficient K.

It should be understood that above steps could be implemented in tool electronic control unit 914 with tool electronic control unit 914 then driving Q1, such as might be the case if Q1 was provided in cordless power tool 102 instead of in battery pack 104. Tool electronic control unit 914 and battery pack electronic control unit 917 may illustratively be microcontrollers programmed to implement the above steps. But it should be understood that tool electronic control unit 914 and battery pack electronic control unit 917 can be any control device capable of implementing the above steps, such as, by way of example and not of limitation, application specific integrated circuits, discrete digital logic, and discrete analog circuits. Further, an alternative tool not having an electronic control unit 914 (not shown) may just have the trigger switch 921 configured as a potentiometer and coupled to battery pack 104 via appropriate terminals in the terminal blocks 118, 136 (FIG. 1) of cordless power tool 102 and battery pack 104. The battery pack electronic control unit 917 would then control the semi-conductor Q1 to switch at the desired duty cycle to create the intended motor speed based on the position of the trigger switch 921 and the coefficient K. The battery pack electronic control unit 917 would then obtain the information about the rated voltage of motor 908 of cordless power tool 102 by reading a code in cordless power tool 102 as discussed above.

Taking a motor 908 having a rated voltage of 24V and battery pack 104 having a rated voltage of 48V as examples, the coefficient K would be 50% or 0.5. When trigger switch 921 is fully closed (having a position percentage of 100%), the duty cycle of the PWM control signal would be 50% of 100%, or 50%, which would be the maximum duty cycle of the PWM control signal. A 50% duty cycle of the PWM control signal results in the voltage of battery pack 104 being applied to motor 908 50% of the time, resulting in an effective voltage of 24V being applied to motor 908 to run motor 908 at full speed. If the trigger switch 921 is half closed, its position percentage would be 50% resulting in a PWM control signal having a 25% duty cycle, with the voltage of battery pack 104 then being applied to motor 908 25% of the time to run motor 908 at half speed.

In an aspect of the invention, modular interface section 802 may illustratively include first and second clamshell sections 806, 808. The clamshell sections 806, 808 are mated together to form modular interface section 802. The clamshell arrangement permits rod 452 to be easily assembled in modular interface section 802 during production. A sleeve 810 is provided in each clamshell section 806, 808. One end of rod 452 is inserted into one of sleeves 810 and the clamshell sections 806, 808 then brought together with the other end of rod 452 being inserted into the other sleeve 810 as this occurs.

Figure 10:
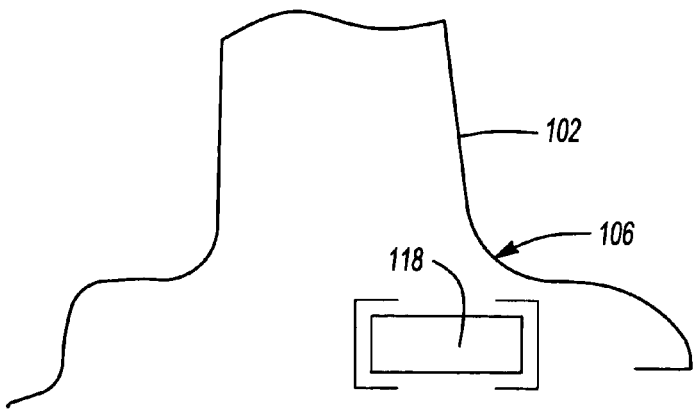
FIG. 10 is a side view of a cordless power tool having a floating terminal block according to an aspect of the invention.

In an aspect of the invention, clamshell sections 806, 808 may illustratively have recesses 812 disposed therein in which a terminal block such as terminal block 136 is received. Terminal block 136 may illustratively be loosely captured in recesses 812 providing a floating terminal block. Also, terminal block 118 may illustratively be loosely mounted in cordless power tool 102 providing a floating terminal block, as shown in FIG. 10.

In an aspect of the invention, terminal block 136 may illustratively have an upwardly (as oriented in FIG. 8C) opening tapered recess 814 disposed therein that mates with a corresponding tapered projection 816 that extends from the bottom 402 of the foot 108 of tool housing 106. When battery pack 104 is inserted into cordless power tool 102, tapered projection 816 engages tapered recess 814 before terminal blocks 118, 136 engage, aligning terminal blocks 118, 136 before their respective terminals begin to mate.

Figure 11A:
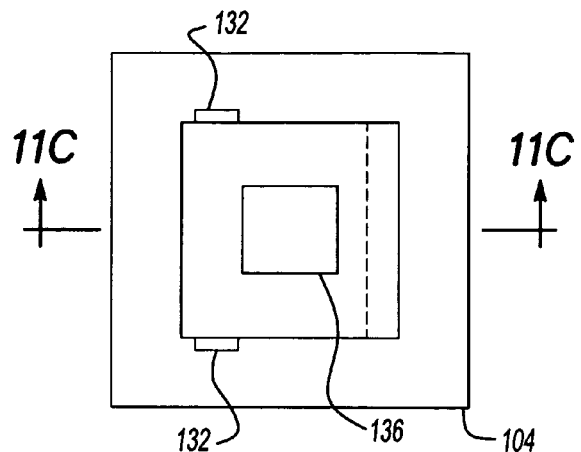
FIG. 11A is a top view of a variation of the cordless power tool and battery pack interface system interface system of FIGS. 1A and 1B.
Figure 11B:
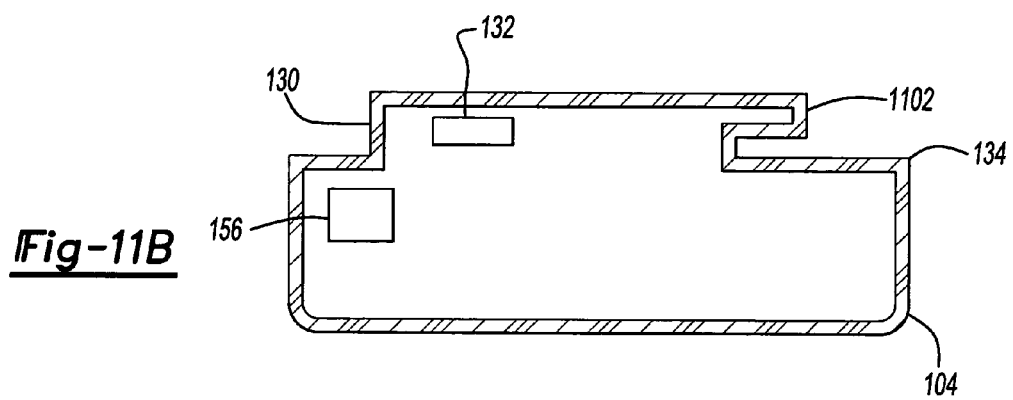
FIG. 11B is a side view of the battery pack of the cordless power tool and battery pack interface system of FIG. 11A.
Figure 11C:
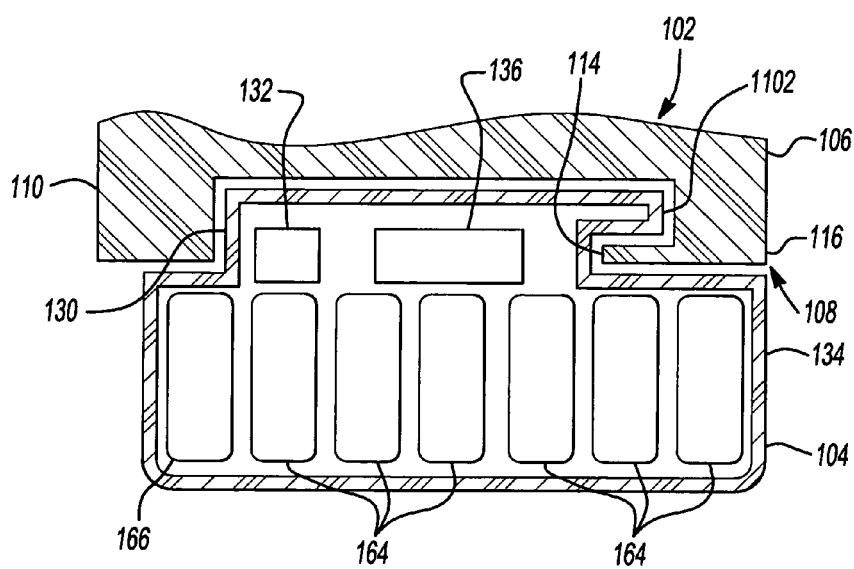
FIG. 11C is a cross-section view of the cordless power tool and battery pack interface system of FIG. 11A taken along the line 11C—11C.

FIGS. 11A–11C show a variation 1100 of the interface system 100 of FIGS. 1A, 1B, 2A and 2B. Like elements are identified with the same reference numbers and only the differences are discussed. Battery pack 104 includes a front retention member 1102, illustratively a lip or flange, under which front retention member 114 of tool housing 106 is received. Latches 132 are disposed in the sides of battery pack 104, such as shown in FIGS. 2A and 2B, but at the upper rear of sides 202, 204 of battery pack 104 as opposed to the front of sides 202, 204. Battery pack 104 is held to cordless power tool 102 by front retention member 114 of tool housing 106 mating with front retention member 1102 of battery pack 104 and by latches 132. Rear retention member 112 of tool housing 106 and rear retention member 128 of battery pack 104 (FIG. 1A) can thus be dispensed with.

The above described inventions each provide one or more of the following advantages. Ease of insertion of the battery pack 104 is comparable to that of the "tower-cell" type of battery pack. The battery pack can be inserted in the cordless power tool with one hand. The latch buttons or actuator members can be located in a natural grip position. Gravity and/or a spring loaded ejector pin aid in removal of the battery pack.

Retention of the battery pack in the cordless power tool is enhanced. The weight bearing elements have more surface area. Separate latch elements and weight bearing elements isolate to a great extent the latch from the weight bearing elements.

Better thermal balance than the "tower-cell" type battery pack is provided. There is no "tower-cell" and the modular interface approach allows for the use of different battery cup designs.

Reliability and manufacturing are enhanced. Since there is no tower-cell, the reliability issues presented by the tower-cell connections are eliminated. The latch system is more robust. A clamshell having mating sections can be used to provide a modular interface section that can be affixed to various different types of battery cups. The modular interface approach reduces tooling requirements. The mating clamshell sections provide for easy assembly of the pivot rod that is used as a retention member in the battery pack. Tolerances of the clamshell sections can be looser since rails are no longer needed.

System expansion is enhanced in that there is available space to enlarge the terminal blocks.

The modular interface approach allows the use of the same interface across all cordless products, battery cell types and battery voltages. A smart tool could accept any battery pack using the modular interface section or a smart battery could be mated to any tool.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A cordless power tool and battery pack combination, comprising:
   a. each of the power tool and battery pack having at least one retention member that pivotally engages the retention member of the other of the power tool and battery pack; and
   b. a latch system including one of the power tool and the battery pack having a ball and the other of the power tool and battery pack having a latch that captures the ball between movable portions of the latch.

2. The apparatus of claim 1 wherein the power tool has the ball and the battery pack has the latch.

3. The apparatus of claim 2 wherein the ball extends toward the battery pack from a bottom of a foot of the power tool.

4. The apparatus of claim 2 wherein the power tool's retention member includes at least one hook extending toward the battery pack and the battery pack's retention member includes at least one rod extending transversely across at least a portion of the battery pack.

5. The apparatus of claim 1 wherein the latch includes inner and outer sleeves that extend laterally across at least a portion of the one of the battery pack and power tool that includes the latch, each sleeve including a recess therein, a portion of the inner sleeve slidably received in a portion of the outer sleeve, the latch including at least one spring that urges the sleeves together to capture the ball between the sleeves in the recesses of the sleeves.

6. The apparatus of claim 5 wherein the ball includes a shaft and the shaft is captured in the recesses of the sleeves.

7. The apparatus of claim 5 wherein the latch includes at least one spring for each sleeve urging the recess in that sleeve toward the recess in the other sleeve.

8. The apparatus of claim 7 wherein each sleeve has an actuator member coupled to it, the actuator members, when pressed, moving the sleeves with respect to each other to open the latch.

9. The apparatus of claim 1 wherein the retention members are at generally a rear of the power tool and battery pack and the latch system is at generally a front of the power tool and battery pack.

10. A cordless power tool and battery pack combination, comprising:
    a. each of the power tool and battery pack having at least one retention member that pivotally engages the retention member of the other of the power tool and battery pack; and
    b. a latch system including the power tool having a ball extending from a bottom of a foot of the power tool and the battery pack having a latch that engages the ball, the latch including inner and outer sleeves that extend laterally across at least a portion of the battery pack, each sleeve including a recess therein, a portion of the inner sleeve slidably received in a portion of the outer sleeve, the latch including at least one spring for each sleeve, the springs urging the sleeves together so that the ball is captured between the recesses of the sleeves.

11. The apparatus of claim 10 wherein the ball includes a shaft and the shaft is captured in the recesses of the sleeve.

12. The apparatus of claim 10 wherein the retention members are at generally a rear of the power tool and battery pack and the latch system is at generally a front of the power tool and battery pack.

13. A battery pack for a power tool having a retention member and a ball, comprising:
   a. at least one retention member that pivotally engages the retention member of the power tool; and
   b. a latch for capturing the ball of the power tool between movable portions of the latch.

14. The apparatus of claim 13 wherein the latch includes inner and outer sleeves that extend laterally across at least a portion of the battery pack, each sleeve including a recess therein, a portion of the inner sleeve slidably received in a portion of the outer sleeve, the latch including at least one spring for each sleeve, the springs urging the sleeves together so that the ball is captured between the recesses of the sleeves.

15. The apparatus of claim 14 wherein the retention member of the battery pack is at generally a rear of the battery pack and the latch is at generally, a front of the battery pack.

* * * * *